United States Patent
Xie et al.

(10) Patent No.: US 12,027,502 B2
(45) Date of Patent: Jul. 2, 2024

(54) MANUFACTURING METHOD OF DISPLAY PANEL, DISPLAY PANEL, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuewu Xie, Beijing (CN); Yu Ai, Beijing (CN); Yubao Kong, Beijing (CN); Shi Sun, Beijing (CN); Bowen Liu, Beijing (CN); Ameng Zhang, Beijing (CN); Hao Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 755 days.

(21) Appl. No.: 17/263,587

(22) PCT Filed: May 25, 2020

(86) PCT No.: PCT/CN2020/092120
§ 371 (c)(1),
(2) Date: Jan. 27, 2021

(87) PCT Pub. No.: WO2020/238854
PCT Pub. Date: Dec. 3, 2020

(65) Prior Publication Data
US 2021/0367117 A1    Nov. 25, 2021

(30) Foreign Application Priority Data
May 31, 2019   (CN) .......................... 201910472073.3

(51) Int. Cl.
*H01L 25/075*   (2006.01)
*H01L 25/00*    (2006.01)
*H01L 33/60*    (2010.01)

(52) U.S. Cl.
CPC .......... *H01L 25/0753* (2013.01); *H01L 25/50* (2013.01); *H01L 33/60* (2013.01); *H01L 2933/0058* (2013.01)

(58) Field of Classification Search
CPC ................ H01L 25/0753; H01L 33/60; H01L 2933/0058
See application file for complete search history.

(56) References Cited

U.S. PATENT DOCUMENTS

| 9,903,997 B2 | 2/2018 | Wang et al. |
| 2015/0362655 A1 | 12/2015 | Wang et al. |
| 2020/0075879 A1 | 3/2020 | Luo et al. |

FOREIGN PATENT DOCUMENTS

| CN | 104061533 A | 9/2014 |
| CN | 105929602 A | 9/2016 |

(Continued)

OTHER PUBLICATIONS

First office action issued in Chinese Patent Application No. 201910472073.3 with search report.

*Primary Examiner* — Robert G Bachner
*Assistant Examiner* — Molly K Reida

(57) ABSTRACT

A method for manufacturing a display panel, a display panel, and a display device. The display panel includes a first substrate and a second substrate arranged opposite to each other, the first substrate includes a first base substrate and a base film layer arranged on a side of the first base substrate close to the second substrate; a surface of the base film layer close to the second substrate is provided with a plurality of concave mirror structures, the second substrate includes a second base substrate and a plurality of light-emitting units (Continued)

arranged on a side of the second base substrate close to the first substrate, and each of the light-emitting units is located at a focal position of a corresponding concave mirror structure of the concave mirror structures.

20 Claims, 4 Drawing Sheets

(56) References Cited

FOREIGN PATENT DOCUMENTS

| | | | | |
|---|---|---|---|---|
| CN | 108169948 A | | 6/2018 | |
| CN | 109148727 A | | 1/2019 | |
| CN | 109256491 A | * | 1/2019 | ......... H01L 27/3244 |
| CN | 109256491 A | | 1/2019 | |
| CN | 208833940 U | | 5/2019 | |
| CN | 110137235 A | | 8/2019 | |

* cited by examiner

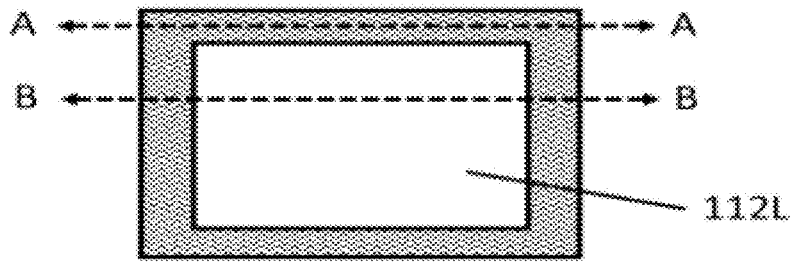

FIG. 6A

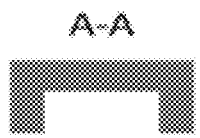

FIG. 6B

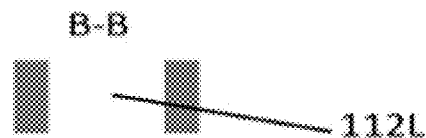

FIG. 6C

| providing a first substrate, the first substrate comprises a first base substrate and a base film layer arranged on a side of the first base substrate close to a second substrate, and a surface of the base film layer close to the second substrate is provided with a plurality of concave mirror structures | 501 |

↓

| providing the second substrate, the second substrate comprises a second base substrate and a plurality of light-emitting units arranged on a side of the second base substrate close to the first substrate | 502 |

↓

| assembling the first substrate with the second substrate in face-to-face manner to form a cell, such that each of the light-emitting units is located at a focus position of a corresponding concave mirror structure of the concave mirror structures | 503 |

FIG. 7

MANUFACTURING METHOD OF DISPLAY PANEL, DISPLAY PANEL, AND DISPLAY DEVICE

CROSS REFERENCES TO RELATED APPLICATIONS

This application is a U.S. National Phase Entry of International Application No. PCT/CN2020/092120 filed on May 25, 2020, designating the United States of America and claiming priority to Chinese Patent Application No. 201910472073.3, filed on May 31, 2019. The present application claims priority to and the benefit of the above-identified applications and the above-identified applications are incorporated by reference herein in their entirety.

TECHNICAL FIELD

Embodiments of the present disclosure relate to a manufacturing method of a display panel, a display panel and a display device.

BACKGROUND

Display devices such as mobile phones, PADs, and TVs mostly use wide viewing angle screens. Since few manufacturers adds anti-peep related technologies into the display devices, the privacy requirements of users cannot be met and information leakage incidents have increased frequently in recent years. With the enhancement of enterprises and individuals' awareness of security protection, there is a great market demand for anti-peep technology of the display devices.

For example, in daily life, ATMs (Automated Teller Machines) provide many conveniences for people. In a case of withdrawing money, it is very important to avoid the leakage of the withdrawal account number and the password. The display screens used in the existing ATMs allows people who observe from a non-orthogonal viewing angle see the display screen, which has a risk of leaking confidential information of the withdrawer.

SUMMARY

Embodiments of the present disclosure provides a display panel, and the display panel comprises: a first substrate and a second substrate arranged opposite to each other; the first substrate comprises a first base substrate and a base film layer arranged on a side of the first base substrate close to the second substrate; a surface of the base film layer close to the second substrate is provided with a plurality of concave mirror structures, the second substrate comprises a second base substrate and a plurality of light-emitting units arranged on a side of the second base substrate close to the first substrate, and each of the light-emitting units is located at a focal position of a corresponding concave mirror structure of the concave mirror structures.

For example, an orthographic projection of each of the light-emitting units on the first base substrate is located in an orthographic projection of one of the concave mirror structures on the first base substrate.

For example, a ratio of a size of each of the light-emitting units in a direction parallel to the first base substrate to a size of the corresponding concave mirror structure in the direction parallel to the first base substrate is less than 1.

For example, the ratio of the size of each of the light-emitting units to the size of the corresponding concave mirror structure ranges from $1/5$ to $1/3$.

For example, surfaces of the concave mirror structures facing towards the light-emitting units are concave surfaces and reflective surfaces.

For example, the surfaces of the concave mirror structures facing towards the light-emitting units are concave spherical surfaces or concave paraboloid surfaces.

For example, each of the concave mirror structures comprises a concave structure arranged on a surface of the base film layer close to the second substrate, and a first reflective layer arranged on a surface of the concave structure.

For example, a surface of the first reflective layer facing away from the concave structure is a concave surface and a reflective surface.

For example, the concave structure is a concave spherical structure or a concave paraboloid structure.

For example, a gas layer or a transparent resin layer is provided between the plurality of concave mirror structures and the second substrate.

For example, each of the light-emitting units comprises a second reflective layer and a light-emitting layer which are stacked arranged, and the second reflective layer is arranged close to the second substrate.

For example, the light-emitting layer comprises a GaAs base layer, an n-AlGaInP layer, an i-AlGaInP layer, a P—AlGaInP layer and an anode layer which are stacked arranged, the second reflective layer is reused as a cathode layer, and the GaAs base layer is arranged close to the second reflective layer.

For example, each of the light-emitting units comprises an anode layer and a cathode layer, the anode layer is located between the cathode layer and the first base substrate, and the anode layer is provided with a hollow portion.

For example, the second substrate further comprises an isolation layer arranged on a side of the second base substrate close to the first substrate, and the isolation layer is arranged between the light-emitting units; and the second substrate further comprises a protective layer arranged on the light-emitting units and the isolation layer, a supporting layer arranged on the protective layer, and an orthographic projection of the supporting layer on the second base substrate is located in an orthographic projection of the isolation layer on the second base substrate.

For example, the surface of the base film layer close to the second substrate further has a planar structure, the planar structure is located between the concave mirror structures, and the planar structure is attached to the supporting layer.

Embodiments of the present disclosure further provide a display panel, and the display panel comprises: a first base substrate; a base film layer arranged on the first base substrate, a surface of the base film layer facing away from the first base substrate is provided with a plurality of concave mirror structures, and the plurality of the concave mirror structures are concave toward the first base substrate; and a plurality of light-emitting units arranged on the side of the base film layer facing away from the first base substrate, the plurality of the light-emitting units correspond to the plurality of the concave mirror structures in one-to-one manner, each of the light-emitting units is located at a focal position of a corresponding concave mirror structure, and surfaces of the concave mirror structures facing towards the light-emitting units are concave surfaces that concave toward the first base substrate and are reflective surfaces.

Embodiments of the present disclosure further provide a display device, and the display device comprises any one of the display panels mentioned in the above embodiments.

Embodiments of the present disclosure further provide a manufacturing method of a display panel, and the manufacturing method comprises: providing the first substrate, the first substrate comprises a first base substrate and a base film layer arranged on a side of the first base substrate close to the second substrate; and a surface of the base film layer close to the second substrate is provided with a plurality of concave mirror structures; providing a second substrate, the second substrate comprises a second base substrate and a plurality of light-emitting units arranged on a side of the second base substrate close to the first substrate; and assembling the first substrate with the second substrate in face-to-face manner to form a cell, such that that each of the light-emitting units is located at a focal position of a corresponding concave mirror structure of the concave mirror structures.

For example, the providing the first substrate comprises: providing the first base substrate; forming a base film material layer on the first base substrate; forming a plurality of concave structures on a surface of the base film material layer by using a patterning process; and forming first reflective layers on the concave structures.

For example, the providing the second substrate comprises: providing the second base substrate; performing a patterning process on the second base substrate to form the light-emitting units and an isolation layer, each of the light-emitting units comprises a second reflective layer and a light-emitting layer which are formed on the second base substrate in sequence; forming a protective layer on the light-emitting units and the isolation layer; forming a supporting layer on the protective layer, an orthographic projection of the supporting layer on the second base substrate is in an orthographic projection of the isolation layer on the second base substrate; and the assembling the first substrate with the second substrate in face-to-face manner to form the cell comprises: attaching the supporting layer of the second substrate to a planar structure of the first substrate by using a vacuum aligning method, the planar structure is located on the surface of the base film layer close to the second substrate and between the concave mirror structures.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

FIG. 6A is a top view schematic diagram of an anode layer of the light-emitting unit in the embodiment of the present application;

FIG. 6B is a cross-sectional view schematic diagram taken along line A-A in FIG. 6A;

FIG. 6C is a cross-sectional view schematic diagram taken along line B-B in FIG. 6A;

FIG. 7 shows a flow chart of steps of a manufacturing method of a display panel provided by an embodiment of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Figure 1:
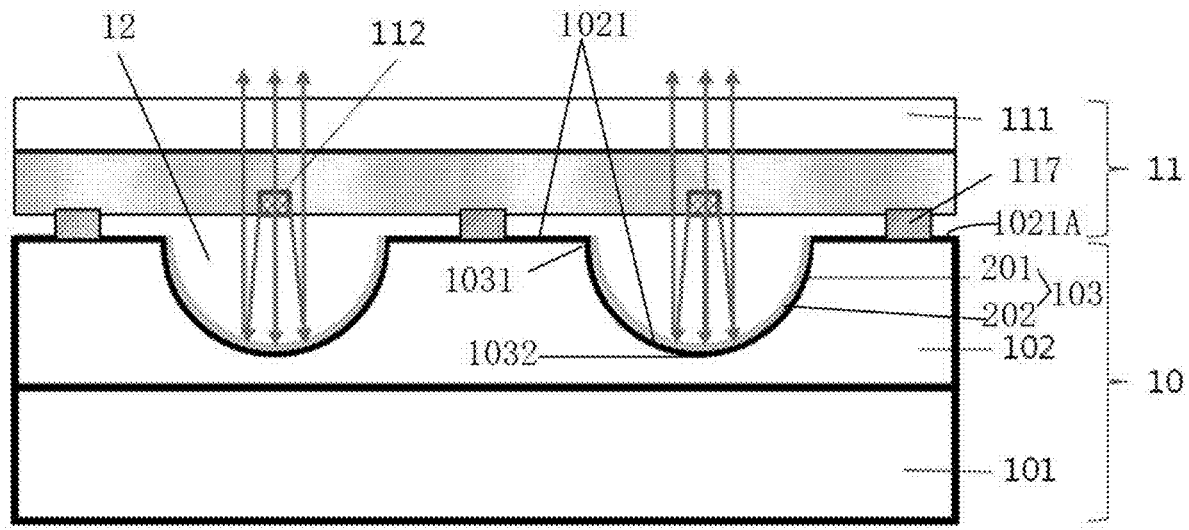
FIG. 1 shows a cross-sectional structure schematic diagram of a display panel provided by an embodiment of the present application.

At least an embodiment of the present application provides a display panel, referring to FIG. 1, the display panel includes a first substrate 10 and a second substrate 11 arranged opposite to each other.

The first substrate 10 includes a first base substrate 101 and a base film layer 102 arranged on a side of the first base substrate 101 close to the second substrate 11. As shown in FIG. 1, the first base substrate 101 has an upper side and a lower side, the upper side of the first base substrate 101 is closer to the second substrate 11 than the lower side of the first base substrate 101, and the base film layer 102 is located on the upper side of the first base substrate 101, so that the base film layer 102 is located between the first base substrate 101 and the second substrate 11. A surface 1021 of the base film layer 102 located on the side close to the second substrate 11 is provided with a plurality of concave mirror structures 103. That is, the base film layer 102 has a surface facing towards the first base substrate 101 and a surface 1021 facing away from the first base substrate 101. The surface 1021 of base film layer 102 is closer to the second substrate 11 than the surface of the base film layer 102 facing towards the first base substrate 101, and the surface 1021 of the base film layer 102 is provided with the plurality of the concave mirror structures 103.

Figure 5:
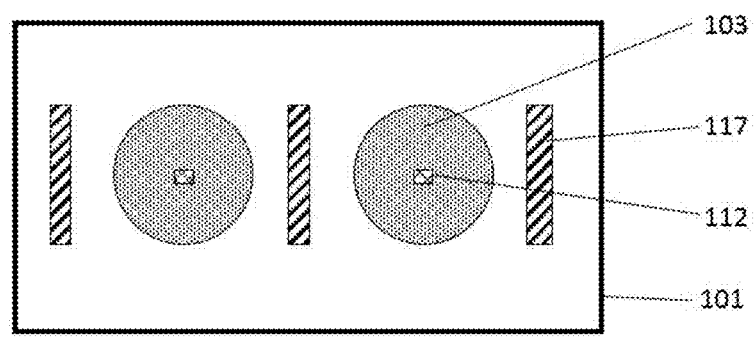
FIG. 5 is a top view schematic diagram of a concave mirror structure, a supporting layer and a light-emitting unit in an embodiment of the present application.

The second substrate 11 includes a second base substrate 111 and a plurality of light-emitting units 112 arranged on a side of the second base substrate 111 close to the first substrate 10. As shown in FIG. 1, the second base substrate 111 has an upper side and a lower side, the lower side of the second base substrate 111 is closer to the first substrate 10 than the upper side of the second base substrate 111, and the light-emitting units 112 are located on the lower side of the second base substrate 111, so that the light-emitting units 112 are located between the second base substrate 111 and the first substrate 10. Each of the light-emitting units 112 is located at a focal-point position of a corresponding concave mirror structure 103. For example, as shown in FIG. 1 and FIG. 5, the light-emitting units 112 correspond to the concave mirror structures 103 in one-to-one manner, that is, an orthographic projection of each of the light-emitting units 112 on the first base substrate 101 is located only in an orthographic projection of one of the concave mirror structures 103 on the first base substrate 101, and the orthographic projection of each of the concave mirror structures 103 contains an orthographic projection of only one of the light-emitting units 112; the focal point of each of the concave mirror structures 103 is located in a region where the light-emitting unit 112 corresponding to the concave mirror structure 103 is located. It should be noted that, for example, the plurality of the light-emitting units 112 in the display panel are arranged into a plurality of rows and a plurality of columns, and FIG. 5 only takes two light-emitting units 112 located in the same row as an example for description.

Each of the concave mirror structures 103 is recessed from an upper surface 1021 of the base film layer 102 (that is a surface of the base film layer 102 away from the first base substrate 101) to the first base substrate 101, that is, each of the concave mirror structures 103 has a top end 1031 and a bottom end 1032, a distance from the top end 1031 to the first base substrate 101 is greater than a distance from the bottom end 1032 to the first base substrate 101, and the bottom end 1032 is located between the top end 1031 and the first base substrate 101 in a direction perpendicular to the upper surface of the first base substrate 101 (that is, the surface of the first base substrate 101 facing towards the base film layer 102).

Figure 4:
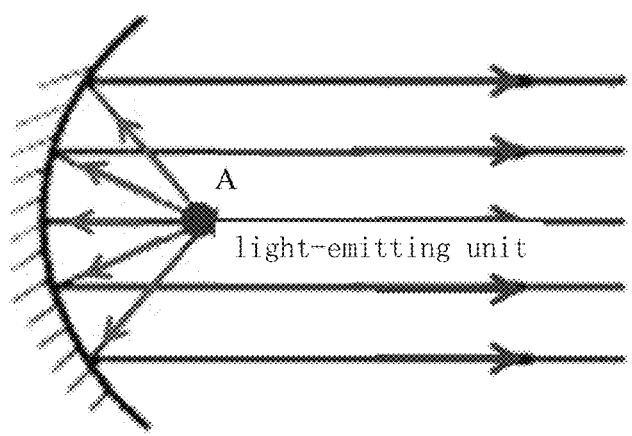
FIG. 4 shows an optical path diagram of parallel light generated by a concave mirror structure provided by an embodiment of the present application.

The concave mirror structures 103 have focal points (as shown as points A in FIG. 2), a surface of each of the concave mirror structures facing towards the corresponding light-emitting unit is a concave surface and a reflective surface, and the focal point of each of the concave mirror structures 103 is a focal point of a surface of each of the concave mirror structures 103 facing towards the corresponding light-emitting unit 112. Each of the concave mirror structures 103 reflects incident light emitted from the corresponding light-emitting unit 112 and incident on the corresponding concave mirror structures 103. In a case that parallel light rays irradiate on one of the concave mirror structures 103, the parallel light rays are reflected by the one of the concave mirror structures 103 and focused on the focal point in front of the one of the concave mirror structures 103; based on the principle, in a case that the corresponding light-emitting unit 112 is located at the focal point, the light emitted by the corresponding light-emitting unit 112 is reflected by the one of the concave mirror structures 103 to form the parallel light rays, as shown in FIG. 1 and FIG. 4.

For example, the light-emitting units 112 include OLED (Organic Light-Emitting Diode) structures or LED (Light-Emitting Diode) structures.

For example, in order to make the light emitted by the light-emitting units 112 be reflected by the concave mirror structures 103 as much as possible, a size of each of the light-emitting units 112 is smaller than a size of the corresponding concave mirror structure 103. For example, as shown in FIG. 1, a ratio of a size of each of the light-emitting units 112 in a direction (that is the horizontal direction in FIG. 1) parallel to the first base substrate 101 to a size of the corresponding concave mirror structure 103 in the direction parallel to the first base substrate 101 is less than 1. For example, the ratio of the size of each of the light-emitting units 112 to the size of the corresponding concave mirror structure 103 ranges from ⅕ to ⅓. For example, the size of each of the light-emitting units 112 in the horizontal direction is from 10 μm to 50 μm, the size of each of the concave mirror structures 103 along the horizontal direction is from 30 μm to 300 μm. For example, the light-emitting units 112 are Micro LEDs or Mini LEDs to have smaller sizes.

In some embodiments, by controlling the ratio of the size of the light-emitting unit 112 to the size of the corresponding concave mirror structure, the parallel light rays emitted by the light emitting units 112 and reflected by the concave mirror structures 103 have better directivity. In this case, the display panel does not include a light-shielding material such as a black matrix between adjacent light-emitting units 112 to prevent crosstalk between adjacent light-emitting units 112.

For example, both the first base substrate 101 and the second base substrate 111 are transparent base substrates, such as glass substrates, quartz substrates, or plastic substrates. For example, both the first base substrate 101 and the second base substrate 111 are flexible substrates.

For example, a material of the base film layer 102 is a resin material.

For example, the display panel has a plurality of pixel units, for example, the plurality of the pixel units are arranged into a plurality of rows and a plurality of columns, each of the pixel units includes a concave mirror structure 103 and a light-emitting unit 112, and the light-emitting units 112 correspond to the concave mirror structures 103 in one-to-one manner.

For example, the plurality of the light-emitting units 112 in the display panel can emit light of different colors, such as red light R, green light G, and blue light B and so on. Because the plurality of the light-emitting units 112 can emit light of different colors, the display panel does not need to include a color filter layer to achieve color display.

For example, the display panel provided by at least one embodiment of the present disclosure further includes a control units, the control unit is connected with the light-emitting unit 112, and the control units are configured to control the brightness of the light emitted by the light-emitting unit 112 in each of the pixel units.

In the display panel provided by the embodiment of the present disclosure, the light-emitting unit is placed at the focal point of the corresponding concave mirror structure, the light emitted by the light-emitting unit is reflected by the corresponding concave mirror structure to form the parallel light rays. By using the display panel of the embodiment, only the users standing directly in front of the screen can see the screen content, people who observe from a non-orthogonal viewing angle cannot see the contents displayed on the screen, so that the leakage of confidential information can be effectively avoided, and the anti-peep function of the display device can be realized. The incident light passes through the focal point of the concave mirror structure and then becomes parallel light parallel to a main axis of the concave mirror structure after being reflected. Because the concave mirror structures adopted in the embodiment of the present disclosure is to form image by reflection, the display panel has no chromatic aberration.

Figure 2:
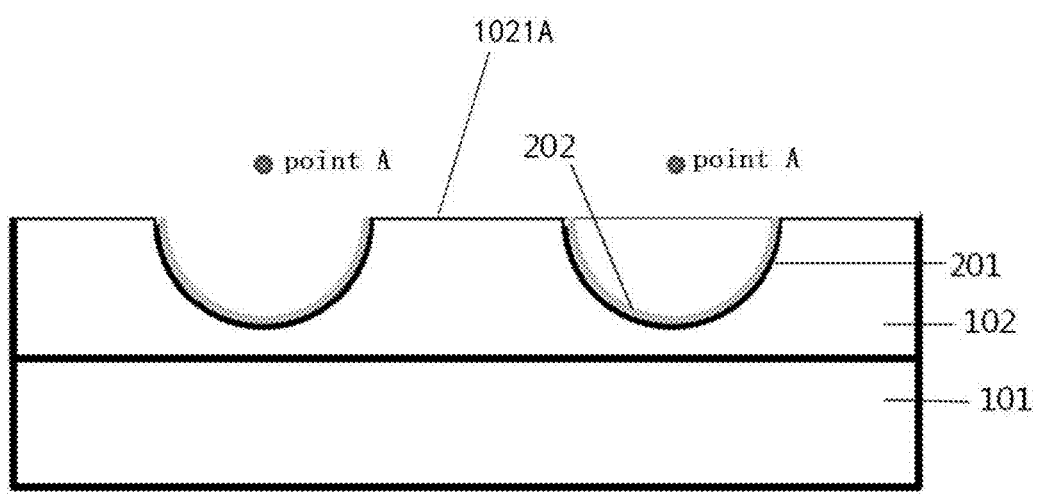
FIG. 2 shows a cross-sectional structure schematic diagram of a first substrate provided by an embodiment of the present application.

Referring to FIG. 2, each of the concave mirror structures 103 includes a concave structure 201 arranged on the surface 1021 of the base film layer 102 close to the second substrate 11 (that is, the surface of the base film layer 102 facing towards the second substrate 11, which is also the surface of the base film layer 102 facing away from the first base substrate 101) and a first reflective layer 202 arranged on the surface of the concave structure 201. The surface of the first reflective layer 202 facing away from the concave structure 201 is a concave surface and a reflective surface, that is, the surface of the first reflective layer 202 facing towards the corresponding light-emitting unit 112 is a concave surface and a reflective surface. For example, the first reflective layer 202 is in directly contact with the concave structure 201, so that the first reflective layer 202 has a concave shape consistent with the concave structure 201, that is, the surface of the first reflective layer 202 facing towards the concave structure 201 and the surface of the concave structure 201 facing towards the first reflective layer 202 are concave surfaces with the same shape (including the size and the contour).

For example, the above surface of the concave mirror structure 103 facing towards the light-emitting unit 112 is a concave spherical surface or a concave paraboloid. For example, in the case that the concave mirror structure 103 includes the concave structure 201 and the first reflective layer 202, the concave structure 201 is a concave spherical structure or a concave paraboloid structure, accordingly, the surface of the first reflective layer 202 facing towards the light-emitting unit 112 has a concave spherical structure or a concave paraboloid structure. In some embodiments, the concave spherical structure may be prone to produce spherical aberration. For example, in some cases, the parallel incident light rays are not well converged on a single focal point after being reflected, and the light emitted by each of the light-emitting units 112 at the focal point may not be parallel after being reflected. In practical applications, for example, better results can be achieved by using the concave paraboloid structure.

For example, the concave structures 201 are formed of partial surfaces of the base film layer 102. For example, the surfaces 1021 of the base film layer 102 facing away from the first base substrate 101 have the concave structures 201 and planar structures 1021A between adjacent concave structures 201 (as shown in FIG. 1 and FIG. 2). In this case, for example, the concave structures 201 are formed by etching a film for forming the base film layer 102.

For example, a material of the first reflective layer 202 is a metal material with a light reflecting function, such as aluminum (Al) or silver (Ag).

Figure 3:
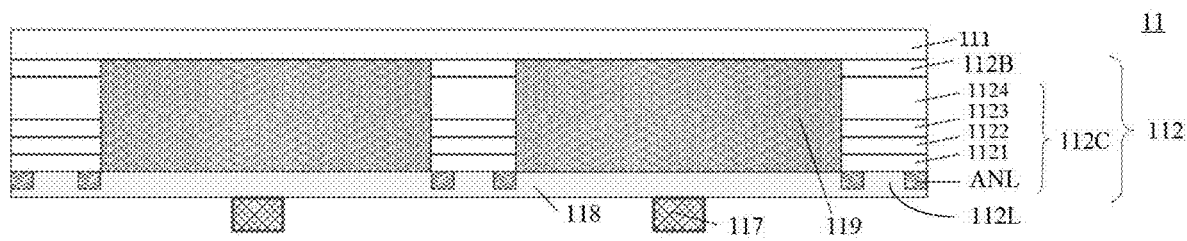
FIG. 3 shows a cross-sectional structure schematic diagram of a second substrate provided by an embodiment of the present application.

For example, the light-emitting units 112 are bottom light-emitting type light-emitting units, that is, the sides of the light-emitting units 112 facing towards the first base substrate 101 emit light, and the sides of the light-emitting units 112 facing away from the first base substrate 101 do not emit light. For example, as shown in FIG. 3, each of the light-emitting units 112 includes an anode layer and a cathode layer 112B, the anode layer is located between the cathode layer 112B and the first base substrate 101 in a direction perpendicular to the above-mentioned surface of the first base substrate 101 (as shown in FIG. 1). For example, the cathode layer 112B is a reflective layer (for example, the reflective layer is made of an opaque metal material) to emit light from the bottom of each of the light-emitting units 112. For example, as shown in FIG. 3 and FIG. 6A to FIG. 6C, the anode layer has hollow portions 112L, and each of the hollow portions 112L penetrates the anode layer. A part of the anode layer located at the periphery of the hollow portions 112L is electrically connected at the edge of the anode layer (as shown in FIG. 6B). By arranging the hollow portions 112L, it is beneficial for the light emitted by the light-emitting units 112 to illuminate as much as possible on the below first substrate. Because the anode layer has the hollow portions 112L that allow light to pass through, in at least one embodiment, the anode layer is made of an opaque metal material to reduce the resistance of the anode layer.

Referring to FIG. 3, in order to prevent the light emitted by the light-emitting units 112 from directly outputting without passing through the corresponding concave mirror structure 103, for example, each of the light-emitting units 112 includes a second reflective layer 112B and a light-emitting layer 112C which are stacked arranged. The second reflective layer 112B is arranged close to the second base substrate 111, that is, the second reflective layer 112B is closer to the second base substrate 111 than the light-emitting layer 112C. In this way, a part of the light emitted from the light-emitting layer 112C is transmitted downward and directly incident on the corresponding concave mirror structure 103, and another part of the light is transmitted upward and then reflected by the second reflective layer 112B to incident on the corresponding concave mirror structure 103, which ensures that all the light emitted from the display panel are reflected by the concave mirror structures 103.

For example, a material of the second reflective layer 112B is a metal material with a light reflection function, such as aluminum Al, silver and Ag.

For example, in an exemplary implementation, referring to FIG. 3, the light-emitting units 112 are Micro LED structures. For example, each of the Micro LED structures adopts an AlGaInP LED structure. For example, the light-emitting layer 112C includes a GaAs base layer 1124, an n-AlGaInP layer 1123, an i-AlGaInP layer 1122, a P—AlGaInP layer 1121, and an anode layer ANL which are stacked arranged. The second reflective layer 112B is multiplexed as the cathode layer, and the GaAs base layer is arranged close to the second reflective layer, that is, the GaAs base layer is closer to the second reflective layer 112B than other layers included in the light-emitting layer 112C. For example, in some embodiments, the second reflective layers 112B included in the plurality of the light-emitting units 112 are directly connected to one another, that is, the plurality of the light-emitting units 112 share the second reflective layer 112B.

In practical applications, for example, the second substrate 11 further includes an isolation layer 119 arranged on the side of the second base substrate 111 close to the first substrate 10 (as shown in FIG. 1), that is, the isolation layer 119 is located between the second base substrate 111 and the first substrate 10, and the isolation layer 119 is arranged between the light-emitting units 112 so that the adjacent light-emitting units 112 are separated from each other. For example, the second substrate 11 further includes a protective layer 118 arranged on the side of the light-emitting units 112 and the isolation layer 119 facing towards the first substrate 10 (that is, the light-emitting units 112 and the isolation layer 119 are located between the protective layer 118 and the second base substrate 111), and a supporting layer 117 arranged on the protective layer 118 (that is, the supporting layer 117 is located between the protective layer 118 and the first substrate 10). The orthographic projection of the supporting layer 117 on the second base substrate 111 is located in the orthographic projection of the isolation layer 119 on the second base substrate 111.

For example, the supporting layer 117 is opaque to reduce crosstalk between the light emitted by adjacent light-emitting units 112.

For example, as shown in FIG. 1 and FIG. 2, the surface 1021 on the side of the base film layer 102 close to the second substrate 11 further has planar structures, each of the planar structure is located between the concave mirror structures 103, and the planar structures are attached to the supporting layer 117. For example, the supporting layer 117 stand against the planar structures, and the orthographic projection of the supporting layer 117 on the planar structures do not exceed the region where the planar structures are located, so that signal lines can be arranged at the positions of the planar structures 117 where the supporting layer 117 is not arranged. For example, the signal lines include gate lines or data lines that are electrically connected with the light-emitting units 112. By arranging the supporting layer 117, it is beneficial to avoid the situation that some foreign matters such as particles in the concave mirror structure 103 damage the reflective surface of the concave mirror structure 103 in a case that the second substrate 11 is pressed. On the other hand, by arranging the supporting layer 107 and adjusting the height of the supporting layer 117, the focal positions of the concave mirror structures 103 can be located in the regions where the light-emitting units 112 are located.

For example, the layer 12 between the concave mirror structures 103 and the second substrate 11 is a gas layer, such as an air layer. In this case, for example, the display panel is manufactured by fabricating the first substrate 10 and the second substrate 11 separately and then assembling the first substrate 10 with the second substrate 11 to form a cell in vacuum (i.e., a vacuum assembling method).

For example, the layer 12 between the concave mirror structures 103 and the second substrate 11 is a transparent resin layer. By filling the concave mirror structures 103 with transparent resin, some foreign matters such as particles in the concave mirror structures 103 can be avoided, so that it is beneficial to avoid damage to the reflective surfaces of the concave mirror structures 103. On the other hand, in some embodiments, by arranging a transparent resin layer, the light-emitting units 112 can be manufactured on the transparent resin layer, so it is not necessary to perform the step of assembling the first substrate 10 with the second substrate 11 in face-to-face manner to form a cell in vacuum (i.e., a vacuum assembling method), thereby simplifying the manufacturing process.

As shown in FIG. 1, the display panel provided by at least another embodiment of the present disclosure includes a first base substrate 101, a base film layer 102 arranged on the first base substrate 101, and a plurality of light-emitting units 112 arranged on a side of the base film layer 102 facing away from the first base substrate 101. A surface 1021 of the base film layer 102 facing away from the first base substrate 101 is provided with a plurality of concave mirror structures 103, and the plurality of the concave mirror structures 103 are concave toward the first base substrate 101. The plurality of the light-emitting units 112 correspond to the plurality of the concave mirror structures 103 in one-to-one manner, and each of the light-emitting units 103 is located at a focal position of a corresponding concave mirror structure 103. Surfaces of the concave mirror structures 103 facing towards the corresponding light-emitting units 112 are concave surfaces and reflective surfaces. The arrangement of the components in the display panel of the present embodiment is same as the arrangement of the same component in any one of the afore-mentioned embodiments, so the description is not repeated herein.

At least another embodiment of the present application provides a display device, and the display device comprises any one of the display panels mentioned in the above embodiments.

It should be noted that, the display device in the embodiment of the present application may be any products or components with a display function, such as a display panel, an electronic paper, a mobile phone, a tablet computer, a television, a notebook computer, a digital photo frame or a navigator.

An embodiment of the present disclosure provides a manufacturing method of a display panel, referring to FIG. 7, the manufacturing method comprises the following steps 501 to 503.

Step 501: providing a first substrate, herein, the first substrate comprises a first base substrate and a base film layer arranged on a side of the first base substrate close to a second substrate, and a surface of the base film layer close to the second substrate is provided with a plurality of concave mirror structures.

Figure 8:
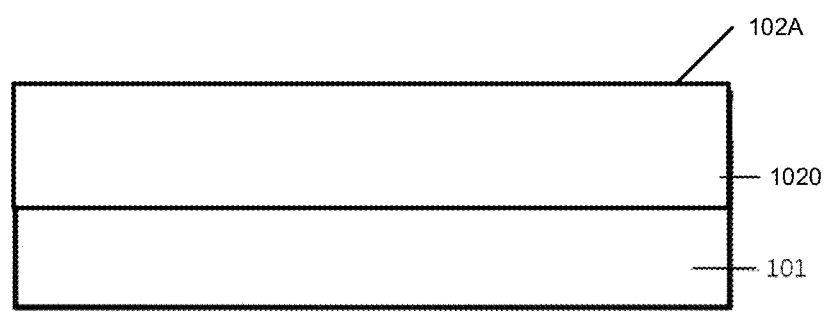
FIG. 8 is a schematic diagram of forming a base film material layer on a first base substrate in the manufacturing method provided by an embodiment of the present disclosure.

For example, in an exemplary implementation, the step 501 includes: as shown in FIG. 8, providing a first base substrate 101; and forming a base film material layer 1020 on the first base substrate 101; forming a plurality of concave structures 201 on a surface 102A of the base film material layer 1020 (the surface 102A is the surface of the base film material layer 1020 facing away from the first base substrate 101) by using a patterning process to obtain a base film layer 102 provided with the plurality of the concave structures 201, as shown in FIG. 1 and FIG. 2; and forming first reflective layers 201 on the concave structures 201, as shown in FIG. 1 and FIG. 2.

For example, a material (such as resin) used for forming the base film material layer 1020 is coated on the first base substrate 101 (such as a glass substrate), and the concave structures 201 are manufactured by using the patterning processes, which includes the following steps, such as exposure and etching of the material. Then, the first reflective layers 202 are formed in the concave structures 201 by evaporation or sputtering method, thereby obtaining the first substrate 10.

Step 502: providing the second substrate, herein, the second substrate comprises a second base substrate and a plurality of light-emitting units arranged on a side of the second base substrate close to the first substrate.

For example, in an exemplary implementation, the step 502 includes: as shown in FIG. 3, providing a second base substrate 111; forming the light-emitting units 112 and an isolation layer 119 on the second base substrate 111 by using the patterning process, herein, each of the light-emitting units 112 comprises a second reflective layer 112B and a light-emitting layer 112C which are formed on the second base substrate 111 in sequence; forming a protective layer 118 on a side of the light-emitting units 112 and the isolation layer 119 away from the second base substrate 111; forming a supporting layer 117 on the protective layer 118, herein, an orthographic projection of the supporting layer 117 on the second base substrate 111 is in an orthographic projection of the isolation layer 119 on the second base substrate 111.

It should be noted that, the patterning process refers to a process of processing the film layer in order to obtain a patterned film structure. The embodiments of the present disclosure do not limit the specific type of patterning process.

For example, the light-emitting units 112 are manufactured by a wet-etching method. For example, the plurality of the light-emitting units 112 in the display panel are arranged into an array, and the array is an LED array having micron structures.

Step 503: assembling the first substrate with the second substrate in face-to-face manner to form a cell, such that each of the light-emitting units is located at a focal position of a corresponding concave mirror structure of the concave mirror structures.

For example, a vacuum assembling method is used to attach the supporting layer 117 of the second substrate 11 to planar structures of the first substrate 10, and the planar structures are located on the surface of the base film layer 102 close to the second substrate 11 and between the concave mirror structures 103.

For example, a vacuum aligning method is used to attach the first substrate provided in the step 501 and the second substrate provided in the step 502. The light-emitting units 112 (such as micro LEDs) are positioned at the focal positions of the concave mirror structures 103 by adjusting a height of the supporting layer 117 and the pressure during the vacuum assembling method. According to the characteristics of a concave mirror, the light emitted by the light-emitting units 112 (such as Micro LEDs) is reflected by the concave mirror structures 103 respectively to become parallel light, and no light is directed to the surrounding locations. By using the display panel of the embodiment, only the users directly in front of the display panel can see the contents displayed on the display screen, which can prevent peeping.

In the manufacturing method of the display panel provided by the embodiment of the present disclosure, the concave mirror structures 103 are fabricated on the first base substrate 101, the light-emitting units 112 are fabricated on the second base substrate 111, and the light-emitting units 112 are placed at the focal positions of the concave mirror structure 103 respectively. By placing the light-emitting units 112 at the focal points of the concave mirror structures 103 respectively, the light emitted by the light-emitting units 112 forms the parallel light rays after being reflected by the concave mirror structures 103. By using the display panel of the embodiments, only the users standing directly in front of the display screen can see the contents displayed on the display screen, people observing from a non-orthogonal viewing angle cannot see the contents displayed on the display screen, which effectively prevents leakage of confidential information and realizes anti-peeping of the display device.

It should be noted that, the order of step 501 and step 502 can be interchanged.

What is described above is related to the illustrative embodiments of the disclosure only and not limitative to the scope of the disclosure; the scopes of the disclosure are defined by the accompanying claims.

What is claimed is:

1. A display panel, comprising: a first substrate and a second substrate arranged opposite to each other;

wherein the first substrate comprises a first base substrate and a base film layer arranged on a side of the first base substrate close to the second substrate; a surface of the base film layer close to the second substrate is provided with a plurality of concave mirror structures, the second substrate comprises a second base substrate and a plurality of light-emitting units arranged on a side of the second base substrate close to the first substrate, and each of the light-emitting units is located at a focal position of a corresponding concave mirror structure of the concave mirror structures, wherein a gas layer is provided between each of the light-emitting unit and the corresponding concave mirror structure.

2. The display panel according to claim 1, wherein an orthographic projection of each of the light-emitting units on the first base substrate is located in an orthographic projection of one of the corresponding concave mirror structures on the first base substrate.

3. The display panel according to claim 1, wherein a ratio of a size of each of the light-emitting units in a direction parallel to the first base substrate to a size of the corresponding concave mirror structure in the direction parallel to the first base substrate is less than 1.

4. The display panel according to claim 3, wherein the ratio of the size of each of the light-emitting units to the size of the corresponding concave mirror structure ranges from 1/5 to 1/3.

5. The display panel according to claim 1, wherein surfaces of the concave mirror structures facing towards the light-emitting units are concave surfaces and reflective surfaces.

6. The display panel according to claim 5, wherein the surfaces of the concave mirror structures facing towards the light-emitting units are concave spherical surfaces or concave paraboloid surfaces.

7. The display panel according to claim 1, wherein each of the concave mirror structures comprises a concave structure arranged on a surface of the base film layer close to the second substrate, and a first reflective layer arranged on a surface of the concave structure.

8. The display panel according to claim 7, wherein a surface of the first reflective layer facing away from the concave structure is a concave surface and a reflective surface.

9. The display panel according to claim 7, wherein the concave structure is a concave spherical structure or a concave paraboloid structure.

10. The display panel according to claim 1, wherein the gas layer is provided between the plurality of concave mirror structures and the second substrate.

11. The display panel according to claim 1, wherein each of the light-emitting units comprises a second reflective layer and a light-emitting layer which are stacked arranged, and the second reflective layer is arranged close to the second substrate.

12. The display panel according to claim 11, wherein the light-emitting layer comprises a GaAs base layer, an n-AlGaInP layer, an i-AlGaInP layer, a P—AlGaInP layer and an anode layer which are stacked arranged, the second reflective layer is multiplexed as a cathode layer, and the GaAs base layer is arranged close to the second reflective layer.

13. The display panel according to claim 1, wherein each of the light-emitting units comprises an anode layer and a cathode layer, the anode layer is located between the cathode layer and the first base substrate, and the anode layer is provided with a hollow portion.

14. The display panel according to claim 1, wherein:
the second substrate further comprises an isolation layer arranged on a side of the second base substrate close to the first substrate, and the isolation layer is arranged between the light-emitting units; and
the second substrate further comprises a protective layer arranged on the light-emitting units and the isolation layer, a supporting layer arranged on the protective layer, and an orthographic projection of the supporting layer on the second base substrate is located in an orthographic projection of the isolation layer on the second base substrate.

15. The display panel according to claim 14, wherein the surface of the base film layer close to the second substrate further has a planar structure, the planar structure is located between the concave mirror structures, and the planar structure is attached to the supporting layer.

16. A display panel, comprising:
a first base substrate;
a base film layer arranged on the first base substrate, wherein a surface of the base film layer facing away from the first base substrate is provided with a plurality of concave mirror structures, and the plurality of the concave mirror structures are concave toward the first base substrate; and
a plurality of light-emitting units arranged on a side of the base film layer facing away from the first base substrate, wherein the plurality of the light-emitting units correspond to the plurality of the concave mirror structures in one-to-one manner, each of the light-emitting units is located at a focal position of a corresponding concave mirror structure, and surfaces of the concave mirror structures facing towards the light-emitting units are concave surfaces that concave toward the first base substrate and are reflective surfaces,
wherein a gas layer is provided between each of the light-emitting unit and the corresponding concave mirror structure.

17. A display device, comprising the display panel according to claim 1.

18. A manufacturing method of a display panel, comprising:
providing the first substrate, wherein the first substrate comprises a first base substrate and a base film layer arranged on a side of the first base substrate close to a second substrate; and a surface of the base film layer close to the second substrate is provided with a plurality of concave mirror structures;
providing a second substrate, wherein the second substrate comprises a second base substrate and a plurality of light-emitting units arranged on a side of the second base substrate close to the first substrate; and
assembling the first substrate with the second substrate in face-to-face manner to form a cell, such that each of the light-emitting units is located at a focal position of a corresponding concave mirror structure of the concave mirror structures, and
providing a gas layer between each of the light-emitting unit and the corresponding concave mirror structure.

19. The manufacturing method according to claim 18, wherein the providing the first substrate comprises:
providing the first base substrate;
forming a base film material layer on the first base substrate;
forming a plurality of concave structures on a surface of the base film material layer by using a patterning process; and
forming first reflective layers on the concave structures.

20. The manufacturing method according to claim 18, wherein the providing the second substrate comprises:
providing the second base substrate;
performing a patterning process on the second base substrate to form the light-emitting units and an isolation layer, wherein each of the light-emitting units comprises a second reflective layer and a light-emitting layer which are formed on the second base substrate in sequence;
forming a protective layer on the light-emitting units and the isolation layer;
forming a supporting layer on the protective layer, wherein an orthographic projection of the supporting layer on the second base substrate is in an orthographic projection of the isolation layer on the second base substrate; and
the assembling the first substrate with the second substrate in face-to-face manner to form the cell comprises:
attaching the supporting layer of the second substrate to a planar structure of the first substrate by using a vacuum aligning method, wherein the planar structure is located on the surface of the base film layer close to the second substrate and between the concave mirror structures.

* * * * *